United States Patent
Kim et al.

(10) Patent No.: US 10,084,149 B2
(45) Date of Patent: Sep. 25, 2018

(54) LIGHT EMITTING DIODE AND DISPLAY DEVICE INCLUDING THE SAME

(71) Applicant: Samsung Display Co., Ltd., Yongin-si, Gyeonggi-do (KR)

(72) Inventors: Dong Chan Kim, Gunpo-si (KR); Dong Kyu Seo, Suwon-si (KR); Won Suk Han, Yongin-si (KR); Yoon Hyeung Cho, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/623,271

(22) Filed: Jun. 14, 2017

(65) Prior Publication Data
US 2018/0047929 A1 Feb. 15, 2018

(30) Foreign Application Priority Data
Aug. 12, 2016 (KR) .......................... 10-2016-0102798

(51) Int. Cl.
*H01L 29/08* (2006.01)
*H01L 51/50* (2006.01)
*H01L 51/52* (2006.01)

(52) U.S. Cl.
CPC ...... *H01L 51/5092* (2013.01); *H01L 51/5072* (2013.01); *H01L 51/5221* (2013.01)

(58) Field of Classification Search
CPC ............. H01L 51/5092; H01L 51/5072; H01L 51/5221
USPC ........................................................ 257/40
See application file for complete search history.

(56) References Cited

U.S. PATENT DOCUMENTS

| | | | |
|---|---|---|---|
| 5,677,572 A | 10/1997 | Hung et al. | |
| 6,492,526 B1 * | 12/2002 | Christou | .................. C07F 5/022 |
| | | | 313/503 |
| 8,389,979 B2 * | 3/2013 | Nowatari | ............ H01L 51/5088 |
| | | | 257/40 |

(Continued)

FOREIGN PATENT DOCUMENTS

| | | |
|---|---|---|
| KR | 10-1003130 B1 | 12/2010 |
| KR | 10-2012-0075272 A | 7/2012 |

(Continued)

OTHER PUBLICATIONS

Chih-I Wu, et al., "Energy structures and chemical reactions at the Al/LiF/Alq$_3$ interfaces studied by synchrotron-radiation photoemission spectroscopy," Applied Physics Letters 87, 212108 (2005), 4 pages.

(Continued)

*Primary Examiner* — Caleb Henry
(74) *Attorney, Agent, or Firm* — Lewis Roca Rothgerber Christie LLP

(57) ABSTRACT

An exemplary embodiment of the present disclosure provides a light emitting diode including: a first electrode; a second electrode configured to overlap the first electrode; an emission layer between the first electrode and the second electrode; and an electron-injection layer between the emission layer and the first electrode, wherein the electron-injection layer includes a compound $XI_n$, in $XI_n$ the subscript n is an integer which is in a range of 1 to 3, and X includes a lanthanide element.

14 Claims, 4 Drawing Sheets

(56) References Cited

U.S. PATENT DOCUMENTS

| | | | | |
|---|---|---|---|---|
| 2003/0171060 A1* | 9/2003 | Hirano | ............... | H01L 51/5218 |
| | | | | 445/24 |
| 2003/0224203 A1* | 12/2003 | Raychaudhuri | ..... | H01L 51/5092 |
| | | | | 428/690 |
| 2006/0145604 A1* | 7/2006 | Liao | ................... | H01L 51/5052 |
| | | | | 313/506 |
| 2006/0251922 A1* | 11/2006 | Liao | ................... | H01L 51/0051 |
| | | | | 428/690 |
| 2008/0221328 A1* | 9/2008 | Reedijk | ............... | C07D 213/79 |
| | | | | 546/5 |
| 2010/0051973 A1* | 3/2010 | Kobayashi | ......... | H01L 51/5092 |
| | | | | 257/88 |
| 2013/0049024 A1* | 2/2013 | Choi | .................. | H01L 51/5092 |
| | | | | 257/88 |
| 2015/0102331 A1* | 4/2015 | Seo | ...................... | H01L 51/504 |
| | | | | 257/40 |
| 2016/0056400 A1* | 2/2016 | Kim | ..................... | H01L 51/504 |
| | | | | 257/40 |

FOREIGN PATENT DOCUMENTS

| | | |
|---|---|---|
| KR | 10-1422864 B1 | 7/2014 |
| KR | 10-2016-0043530 a | 4/2016 |

OTHER PUBLICATIONS

Yang Li, et al., "Investigation of an efficient $YbF_3$/Al cathode for tris—(8-hydroxyquinoline)aluminum-based small molecular organic light-emitting diodes," Applied Surface Science 254, pp. 7223-7226, (2008).

* cited by examiner

LIGHT EMITTING DIODE AND DISPLAY DEVICE INCLUDING THE SAME

CROSS-REFERENCE TO RELATED APPLICATION

This application claims priority to and the benefit of Korean Patent Application No. 10-2016-0102798 filed in the Korean Intellectual Property Office on Aug. 12, 2016, the entire contents of which are incorporated herein by reference.

BACKGROUND

1. Field

Embodiments of the present disclosure relate to a light-emitting diode and a display device including the same.

2. Description of Related Art

An organic light emitting diode (OLED) display device is a self-luminous display device having a wide viewing angle, excellent contrast, and fast response time.

The OLED display device includes organic light emitting diodes for emitting light. In such an organic light emitting diode, electrons injected from one electrode and holes injected from another electrode are combined in the organic emission layer to generate excitons, and the generated excitons release energy to emit light.

Thus, improving the injection speed of holes and electrons improves efficiency of the organic light emitting diode.

The above information disclosed in this Background section is only for enhancement of understanding of the background of the present disclosure and therefore it may contain information that does not form the prior art that is already known in this country to a person of ordinary skill in the art.

SUMMARY

Exemplary embodiments have been made in an effort to provide a light emitting diode having improved emission efficiency, and a display device including the same.

An exemplary embodiment of the present disclosure provides a light emitting diode including: a first electrode; a second electrode configured to overlap the first electrode; an emission layer disposed between the first electrode and the second electrode; and an electron-injection layer disposed between the emission layer and the first electrode, wherein the electron-injection layer includes a compound (or an element) $XI_n$, the subscript n is an integer which is in a range of 1 to 3, and the element X is a lanthanide element.

The element X may include at least one selected from Lu, La, Ce, Pr, Nd, Pm, Sm, Eu, Gd, Tb, Dy, Ho, Er, Tm, and Yb.

The electron-injection layer may include at least one selected from $SmI_2$, $YbI_2$, and $EuI_2$.

The light emitting diode may further include an electron-transporting layer disposed between the electron-injection layer and the emission layer.

A thickness of the electron-injection layer may be in a range of 1 to 30 Å.

The first electrode may serve as a cathode, and the second electrode may serve as an anode.

The first electrode may include at least one selected from Ag, Mg, and Yb.

The first electrode may include AgMg, and a content (e.g., a vol %) of Ag may be greater than that of Mg.

An exemplary embodiment of the present disclosure provides a display device including: a substrate; a transistor disposed on the substrate; and a light emitting diode coupled with the transistor, the light emitting diode may include: a first electrode; a second electrode configured to overlap the first electrode; an emission layer disposed between the first electrode and the second electrode; and an electron-injection layer disposed between the emission layer and the first electrode, and the electron-injection layer includes a compound (or an element) $XI_n$, the subscript n is an integer which is in a range of 1 to 3, and the element X is a lanthanide element.

The element X may include at least one selected from Lu, La, Ce, Pr, Nd, Pm, Sm, Eu, Gd, Tb, Dy, Ho, Er, Tm, and Yb.

The electron-injection layer may include at least one selected from $SmI_2$, $YbI_2$, and $EuI_2$.

A thickness of the electron-injection layer may be in a range of 1 to 30 Å.

The first electrode may include at least one selected from Ag, Mg, and Yb.

The first electrode may include AgMg, and a content (e.g., a vol %) of Ag may be greater than that of Mg.

According to the exemplary embodiments, it is possible to provide a light emitting diode having improved emission efficiency, and a display device including the same.

BRIEF DESCRIPTION OF THE DRAWINGS

The accompanying drawings, together with the specification, illustrate embodiments of the subject matter of the present disclosure, and, together with the description, serve to explain principles of embodiments of the subject matter of the present disclosure.

DETAILED DESCRIPTION

Figure 1:
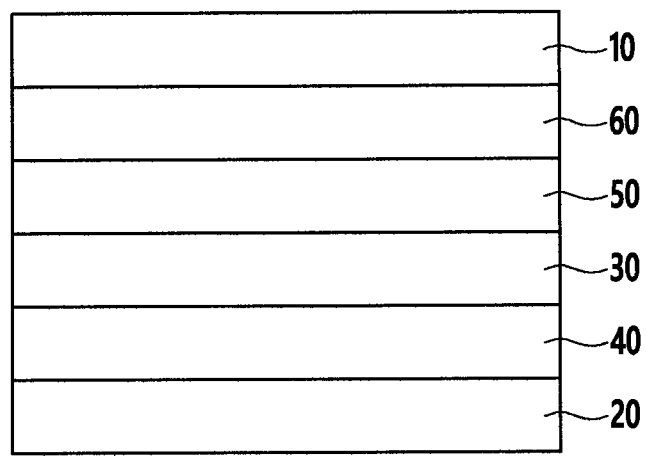
FIG. 1 is a cross-sectional view illustrating a light emitting diode according to an exemplary embodiment.

The present disclosure will be described more fully hereinafter with reference to the accompanying drawings, in which exemplary embodiments of the present disclosure are shown. As those skilled in the art would realize, the described embodiments may be modified in various different ways, all without departing from the spirit or scope of the present disclosure.

To clearly describe embodiments of the present disclosure, parts or features that are irrelevant to the description may be omitted, and like numerals refer to like or similar constituent elements throughout the specification.

Further, since sizes and thicknesses of constituent members shown in the accompanying drawings may be arbitrarily given for better understanding and ease of description, the present disclosure is not limited to the illustrated sizes and thicknesses. In the drawings, the thicknesses of layers, films, panels, regions, etc., may be exaggerated for clarity. In the drawings, for better understanding and ease of description, the thicknesses of some layers and areas are exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. In addition, it will also be understood that when an element or layer is referred to as being "between" two elements or layers, it can be the only element or layer between the two elements or layers, or one or more intervening elements or layers may also be present. Further, in the specification, the word "on" or "above" means positioned on or above (or below depending on the point of view) the object portion, and does not necessarily mean positioned on the upper side of the object portion based on a gravitational direction.

In addition, unless explicitly described to the contrary, the word "comprise" and variations such as "comprises" or "comprising" will be understood to imply the inclusion of stated elements but not the exclusion of any other elements.

Further, in the specification, the phrase "in a plan view" means an object portion is viewed from above, and the phrase "in a cross-section" means a cross-section taken by vertically cutting an object portion is viewed from the side.

FIG. 1 is a cross-sectional view illustrating a light emitting diode according to an exemplary embodiment. Referring to FIG. 1, the light emitting diode according to the present exemplary embodiment includes a first electrode 10, a second electrode 20 disposed to overlap the first electrode 10, and an emission layer 30 disposed between the first electrode 10 and the second electrode 20. A hole-transporting layer 40 is disposed between the second electrode 20 and the emission layer 30. In addition, an electron-transporting layer 50 is disposed between the first electrode 10 and the emission layer 30, and an electron-injection layer 60 is disposed between the electron-transporting layer 50 and the first electrode 10.

The electron-injection layer 60 contains an iodide of the lanthanide element. For example, the electron-injection layer 60 contains a compound (or an element) $XI_n$. In this case, n is an integer between 1 to 3, and the element X indicates a lanthanide element.

In the present exemplary embodiment, the element X may include one or more selected from Lu, La, Ce, Pr, Nd, Pm, Sm, Eu, Gd, Tb, Dy, Ho, Er, Tm, and Yb. In addition, in an exemplary embodiment, the electron-injection layer 60 may include one or more selected from $SmI_2$, $YbI_2$, and $EuI_2$.

In the present exemplary embodiment, when the electron-injection layer 60 contains an iodide of the lanthanide element, an electron injection barrier between the first electrode 10 and the light emitting layer 30 may be lowered to improve efficiency of the organic light emitting diode. A detailed effect thereof will be described herein in more detail.

In the present exemplary embodiment, the first electrode 10 may serve as a cathode, and the second electrode 20 may serve as an anode. The first electrode 10 may serve as an electrode for injecting electrons into the emission layer 30 by receiving a current, and may include a material having a low work function. The second electrode 20 serving as the anode may inject holes into the emission layer 30 by receiving a current, and may include a material having a high work function. However, the present disclosure is not limited thereto. For example, according to another exemplary embodiment, the first electrode 10 may serve as the anode, and the second electrode 20 may serve as the cathode.

Each of the first electrode 10 and second electrode 20 may include a conductive oxide such as indium tin oxide (ITO), indium zinc oxide (IZO), zinc tin oxide (ZTO), copper indium oxide (CIO), copper zinc oxide (CZO), gallium zinc oxide (GZO), aluminum zinc oxide (AZO), tin oxide ($SnO_2$), zinc oxide (ZnO), or a combination thereof, and a conductive polymer such as calcium (Ca), ytterbium (Yb), aluminum (Al), silver (Ag), magnesium (Mg), samarium (Sm), titanium (Ti), gold (Au), or an alloy thereof, graphene, carbon nanotubes, or PEDOT:PSS. As used herein, the term "combination thereof" may refer to a chemical combination (e.g., an alloy or chemical compound), a mixture, or a laminated structure of components. However, each of the first electrode 10 and the second electrode 20 is not limited thereto, but may be formed to have a stacked structure including two or more layers.

In addition, according to an exemplary embodiment, the first electrode 10 may include at least one material selected from Ag, Mg, Al, and Yb. For example, the first electrode 10 may include AgMg. In this case, a Ag content (e.g., a vol %) of the first electrode 10 may be greater than a Mg content (e.g., a vol %) thereof. In this case, the Mg content may be about 10 vol %. A thickness of the first electrode 10 can be in a range of 80 Å to 100 Å.

In the present exemplary embodiment, the second electrode 20 may be a reflecting electrode having a structure of ITO/Ag/ITO, and the first electrode 10 may be a transflective electrode including AgMg. In this case, light is reflected by the second electrode 20 to emit it to a top surface of the first electrode 10.

The emission layer 30 may include an emission layer host and light-emitting dopant. In this case, the content of the light emitting dopant may vary depending on a material forming an emission layer, but generally, the content of the light emitting dopant may be in the range of about 3 to about 10 parts by weight based on 100 parts by weight of the material forming the emission layer (total weight of the host and the dopant).

A material of a emission layer host may include tris(8-hydroxy-quinolinato)aluminum (Alq3), 9,10-di(naphth-2-yl)anthracene (AND), 3-tert-butyl-9,10-di(naphth-2-yl)anthracene (TBADN), 4,4'-bis(2,2-diphenyl-ethene-1-yl)-4,4'-dimethylphenyl (DPVBi), 4,4'-bisbis (2,2-diphenyl-ethene-1-yl)-4,4'-methylphenyl (p-DMDPVBi), tert(9,9-diarylfluorene)s (TDAF), 2-(9,9'-spirobifluorene-2-yl)-9,9'-spirobifluorene (BSDF), 2,7-bis(9,9'-spirobifluorene-2-yl)-9,9'-spirobifluorene (TSDF), bis(9,9-diarylfluorene)s (BDAF), 4,4'-bis(2,2-diphenyl-ethene-1-yl)-4,4'-di-(tert-butyl)phenyl (p-TDPVBi), and/or the like, and a phosphorescent host may have a material including 1,3-bis(carbazole-9-yl)benzene (mCP), 1,3,5-tris(carbazole-9-yl)benzene (tCP), 4,4',4"-tris(carbazole-9-yl)triphenylamine (TcTa), 4,4'-bis(carbazole-9-yl)biphenyl (CBP), 4,4'-bis(9-carbazolyl)-2,2'-dimethyl-biphenyl (CBDP), 4,4'-bis(carbazole-9-yl)-9,9-dimethyl-fluorene (DMFL-CBP), 4,4'-bis(carbazole-9-yl)-9,9-bis(9-phenyl-9H-carbazole)fluorene (FL-4CBP), 4,4'-bis(carbazole-9-yl)-9,9-di-tolyl-fluorene (DPFL-CBP), 9,9-bis(9-phenyl-9H-carbazole)fluorene (FL-2CBP), and/or the like.

The dopant may include 8-hydroxyquinoline and complexes of similar derivatives, or benzazole derivatives, but it is not limited thereto.

An electron-transporting layer 50 is disposed between the emission layer 30 and the electron-injection layer 60. The electron-transporting layer 50 may have at least one compound selected from a group consisting of a quinoline derivative, for example, tris(8-hydroxyquinolinato)aluminum (Alq3), 3-(4-biphenyl)-4-phenyl-5-(4-tert-butylphenyl)-1,2,4-triazole (TAZ), (2-methyl-8-quninolinato)-4-phenylphenolate (BAlq), bis(10-hydroxybenzo(h)quinolinato) beryllium (Bebq2), and 4,7-diphenyl-1-10-phenanthroline (BPhen). In some embodiments, the electron-transporting layer 50 may include a compound selected from the group and doped with Liq. In this case, a doping concentration may be about 50 wt %.

A hole-transporting layer 40 may be disposed between the emission layer 30 and the second electrode 20. The hole-transporting layer 40 may be formed of a carbazole derivative such as N-phenylcarbazole, polyvinylcarbazole, and a typical amine derivative having an aromatic condensed ring such as N,N'-bis(3-methylphenyl)-N,N'-diphenyl-[1,1-biphenyl]-4,4'-diamine (TPD) and N,N'-di(naphthalene-1-yl)-N,N'-diphenyl benzidine (NPD).

Although not illustrated, a hole-injection layer may be further included in the hole-transporting layer 40 and the second electrode 20.

In the organic light emitting diode according to the present exemplary embodiment, the electron-injection layer 60 contains an iodide of the lanthanide element. This iodide of the lanthanide element can improve efficiency of the organic light emitting diode. For example, when the iodide of the lanthanide element is included in the electron-injection layer, it is possible to further improve the electron injecting performance as compared with the case in which the lanthanide metal is included in the electron-injection layer 60.

Figure 2:
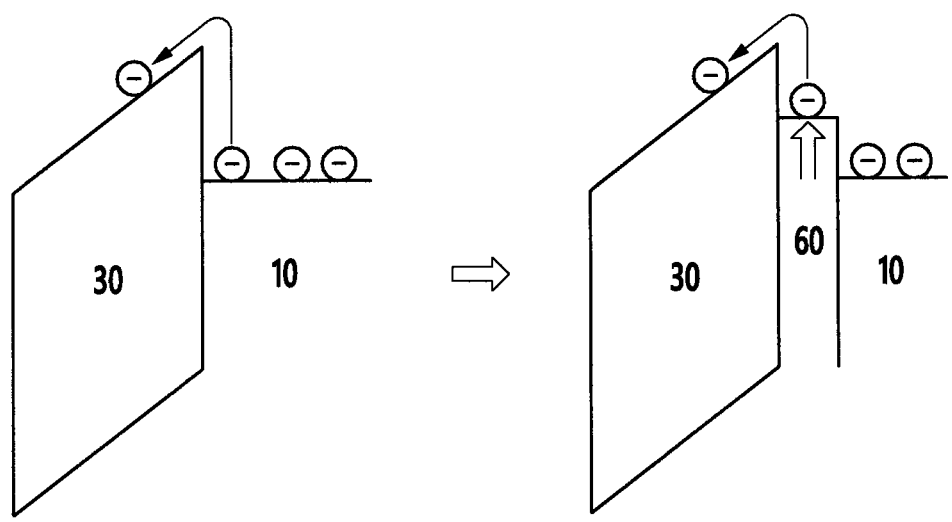
FIG. 2 is a perspective view illustrating a variation of an energy band of a light emitting diode according to a comparative example, including a lanthanide element as a material of an electron-injection layer.
Figure 3:
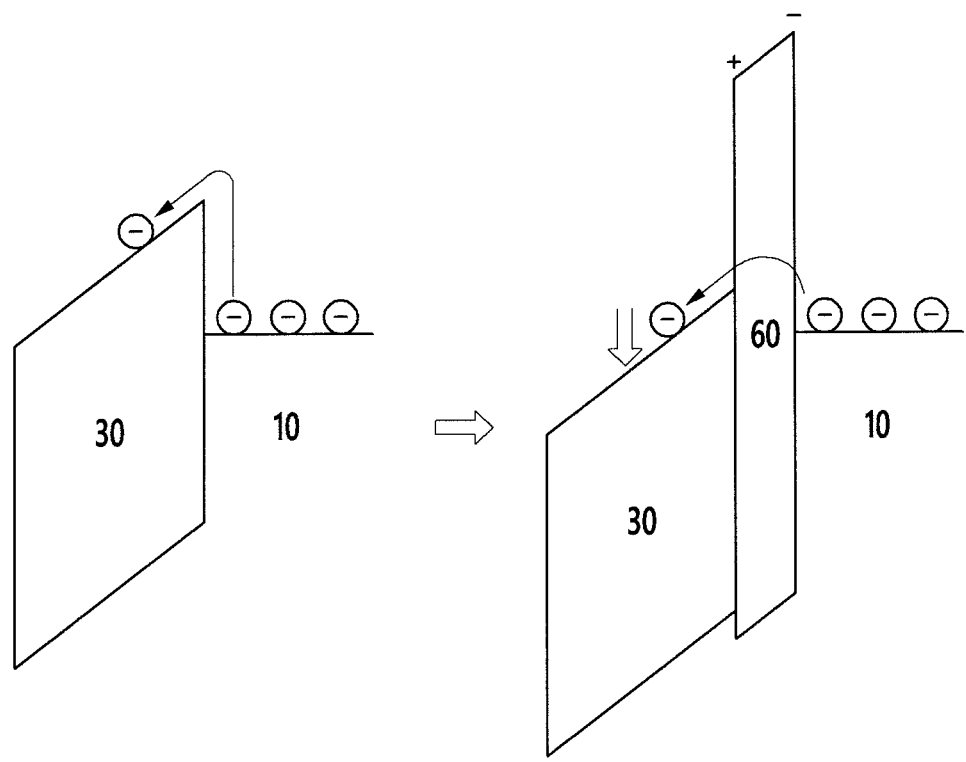
FIG. 3 is a perspective view illustrating a variation of an energy band of a light emitting diode according to an example, including an iodide of a lanthanide element as a material of an electron-injection layer.

FIG. 2 illustrates a variation of an energy band of a light emitting diode according to a comparative example, including a lanthanide metal as the material of an electron-injection layer 60. FIG. 3 illustrates a variation of an energy band of a light emitting diode according to an example, including a lanthanide metal as the material of an electron-injection layer 60.

In FIG. 2 and FIG. 3, since the first electrode 10 is formed of a metal having conductivity and the emission layer 30 is formed of an organic material, an energy band barrier (e.g., and energy band gap) occurs at an interface between the metal and the organic material. When electrons are injected from the first electrode 10 into the emission layer 30, the energy band barrier serves as an obstacle to reduce an electron injecting speed, and this leads to a reduction in the efficiency of the light emitting diode.

When the electron-injection layer 60 including a metal is disposed between the first electrode 10 and the emission layer 30 as shown in FIG. 2 to solve this problem, the electron-injection layer 60 including the metal compensates for the barrier while increasing an energy band of the first electrode 10 at the interface between the first electrode 10 and the emission layer 30.

However, according to this method, an energy band difference still exists in the first electrode 10 and the electron-injection layer 30. Accordingly, it may be difficult to provide suitable or satisfactory electron injecting performance.

However, in the organic light emitting diode according to the present exemplary embodiment, the electron-injection layer 60 containing a halide compound of the lanthanide metal, e.g., the iodide of the lanthanide metal, is disposed between the first electrode 10 and the emission layer.

This iodide of the lanthanide metal has a dielectric characteristic. Accordingly, when a current is applied as shown in FIG. 3, n positive charges and negative charges are respectively arranged at an interface between the emission layer 30 and the electron-injection layer 60 and an interface between the first electrode 10 and the electron-injection layer 60. As shown in FIG. 3, this charge arrangement reduces LUMO energy of the emission layer 30, and thus a height of the barrier between the energy bands of the emission layer 30 and the first electrode 10 is lowered. In this case, a thickness of the electron-injection layer 60 is in a range of 1 Å to 20 Å. Accordingly, since the thickness of the electron-injection layer 60 is small, electrons are injected into the emission layer 30 from the first electrode 10 through the electron-injection layer 60 by tunneling (by electron tunneling, also referred to as quantum tunneling). Accordingly, when the electron-injection layer containing the iodide of the lanthanide metal is applied as in the present exemplary embodiment, the electron injection performance is improved and thus the light emitting performance of the organic light emitting diode is improved, as compared with the electron-injection layer including the metal.

To verify this improvement, driving voltages and efficiencies were measured for Experimental Examples 1 to 3 in which iodides of lanthanide elements such as $SnI_2$, $YbI_2$, and $EuI_2$ were respectively applied to the electron-injection layer and Comparative Examples 1 to 3 in which lanthanide metals such as Sm, Yb, and Eu were respectively applied to the electron-injection layer, and Comparative Example 4 in which an iodide of a non-lanthanide metal (e.g., RbI) was applied thereto. The results are shown in Table 1. In this case, each thickness of the electron-injection layers was set to be 13 Å. Further, in these experiments, the first electrode contains AgMg in which a Ag content (e.g., a vol %) is greater than a Mg content (e.g., a vol %). The driving voltage is a value obtained by measuring a voltage required for the organic light emitting diode to display a same luminance, and the efficiency (Cd/A) is a luminance displayed when a same current is applied. As a result, the organic light emitting diode having lower driving voltage and higher efficiency can have better performance.

TABLE 1

|  | Red | | Blue | |
| --- | --- | --- | --- | --- |
|  | Driving voltage (V) | Efficiency (cd/A) | Driving voltage (V) | Efficiency (cd/A) |
| Experimental Example 1 $SmI_2$ | 4.8 | 58 | 3.8 | 148 |
| Experimental Example 2 $YbI_2$ | 4.7 | 61 | 3.7 | 152 |
| Experimental Example 3 $EuI_2$ | 4.7 | 61 | 3.7 | 155 |
| Comparative Example 1 (Sm) | 5.2 | 48 | 4.3 | 118 |
| Comparative Example 2 (Yb) | 5.2 | 50 | 4.2 | 123 |
| Comparative Example 3 (Eu) | 5.1 | 52 | 4.2 | 125 |
| Comparative Example 4 (RbI) | 5 | 55 | 4.1 | 135 |

As shown in Table 1, Experimental Examples 1 to 3 in which the iodides of the lanthanide metals are applied to the electron-injection layer accomplish better performance as compared with Comparative Examples 1 to 3 in which the lanthanide metal is applied to the electron-injection layer. In other words, the organic light emitting diode of Experimental Examples 1 to 3 has lower driving voltage and higher efficiency.

Further, the efficiency of Experimental Examples 1 to 3 is outstanding as compared with Comparative Example 4 in which the iodide of Rb is applied to the electron-injection layer. This is because an interface polarization ratio of the lanthanide metal according to the voltage application is higher than that of the alkali metal or alkaline earth metal.

According to the present exemplary embodiment, the electron-injection layer contains an iodide of a lanthanide metal. Chlorine and bromine among the halogens are highly poisonous substances that cause environmental pollution, but iodine is relatively safe.

Figure 4:
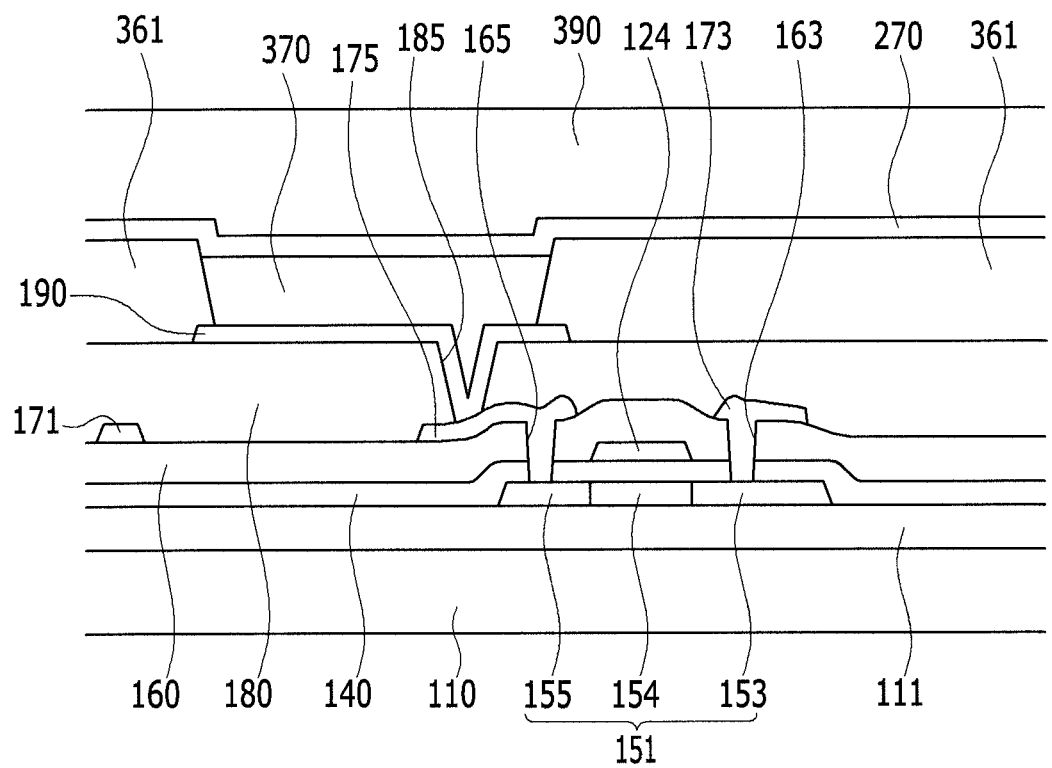
FIG. 4 is a cross-sectional view illustrating a display device according to an exemplary embodiment.

Next, a display device according to an exemplary embodiment will be described with reference to FIG. 4. FIG. 4 is a cross-sectional view illustrating a display device according to the exemplary embodiment.

Referring to FIG. 4, a blocking layer 111 formed of a silicon oxide or a silicon nitride is disposed on a substrate 110.

A semiconductor layer 151 is disposed on the blocking layer 111. The semiconductor layer 151 includes a source region 153 and a drain region 155 doped with p-type impurity, and a channel region 154 disposed between the source region 153 and the drain region 155.

A gate insulating layer 140 may be disposed on the semiconductor layer 151 and the blocking layer to include a silicon oxide or a silicon nitride. A control electrode 124 may be disposed on the gate insulating layer 140 to overlap the channel region 154 of the semiconductor layer 151.

An interlayer insulating layer 160 may be disposed on the control electrode 124 and the gate insulating layer 140. The interlayer insulating layer 160 has a first contact hole 165 and a second contact hole 163.

Data conductors including a data line 171, an input electrode 173, and an output electrode 175 is disposed on the interlayer insulating layer 160.

The output electrode 175 is coupled with (e.g., connected with) the drain region 155 through the first contact hole 165. In addition, the input electrode 173 is coupled with (e.g., connected with) the source region 153 through the second contact hole 163.

A passivation layer 180 is disposed on the data conductors 171, 173, and 175 and the interlayer insulating layer 160, and has a contact hole 185.

A pixel electrode 190 is disposed on the passivation layer 180. The pixel electrode 190 is coupled with (e.g., connected with) the output electrode 175 through the contact hole 185. A partition wall 361 is disposed on the passivation layer 180. A light emitting diode layer 370 is disposed to overlap the pixel electrode 190, and a common electrode 270 is disposed to the light emitting diode layer 370. The light emitting diode includes the pixel electrode 190, the light emitting diode layer 370, and the common electrode 270.

In this case, the pixel electrode 190 may serve as an anode which is the hole injection electrode and may correspond to the second electrode 20 described in FIG. 1, and the common electrode 270 may serve as a cathode which is the electron injecting electrode and may correspond the first electrode 10 described in FIG. 1. However, the present disclosure is not limited thereto. According to the driving method of the display device, the pixel electrode 190 may serve as the cathode, and the common electrode 270 may serve as the anode.

The light emitting diode layer 370 may include the emission layer 30, the electron-injection layer 60, and the like which have been described in FIG. 1. Accordingly, a repeated description thereof is not necessary here.

An encapsulation layer 390 is disposed to overlap the common electrode 270. The encapsulation layer 390 may include an organic material or an inorganic material, or may be obtained by alternately stacking the organic material and the inorganic material. The encapsulation layer 390 may protect the display device against external moisture, heat, and other contaminates.

The above-described structure of the display device is an example, and the light emitting diode according to one exemplary embodiment of the present disclosure may be applied to a display device having another structure.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

As used herein, the terms "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

While the subject matter of the present disclosure has been described in connection with what is presently considered to be practical exemplary embodiments, it is to be understood that the present disclosure is not limited to the disclosed embodiments, but, on the contrary, is intended to cover various modifications and equivalent arrangements included within the spirit and scope of the appended claims, and equivalents thereof.

| Description of Some of the Symbols | |
| --- | --- |
| 10: first electrode | 20: second electrode |
| 30: emission layer | 40: hole-transporting layer |
| 50: electron-transporting layer | 60: electron-injection layer |

What is claimed is:

1. A light emitting diode comprising:
a first electrode;
a second electrode overlapping the first electrode;
an emission layer between the first electrode and the second electrode; and
an electron-injection layer between the emission layer and the first electrode,
wherein the electron-injection layer comprises a compound $XI_n$,
wherein in $XI_n$ the subscript n is an integer which is in a range of 1 to 3, and
wherein X is a lanthanide element.

2. The light emitting diode of claim 1, wherein X is at least one selected from the group consisting of Lu, La, Ce, Pr, Nd, Pm, Sm, Eu, Gd, Tb, Dy, Ho, Er, Tm, and Yb.

3. The light emitting diode of claim 1, wherein $XI_n$ comprises at least one selected from the group consisting of $SmI_2$, $YbI_2$, and $EuI_2$.

4. The light emitting diode of claim 1, further comprising:
an electron-transporting layer between the electron-injection layer and the emission layer.

5. The light emitting diode of claim 1, wherein a thickness of the electron-injection layer is in a range of 1 to 30 Å.

6. The light emitting diode of claim 1, wherein the first electrode serves as a cathode, and the second electrode serves as an anode.

7. The light emitting diode of claim 1, wherein the first electrode comprises at least one selected from the group consisting of Ag, Mg, and Yb.

8. The light emitting diode of claim 7, wherein the first electrode comprises AgMg, and a content of Ag is greater than that of Mg.

9. A display device comprising:
a substrate;
a transistor on the substrate; and
a light emitting diode coupled with the transistor,
wherein the light emitting diode comprises:
a first electrode;
a second electrode overlapping the first electrode;
an emission layer between the first electrode and the second electrode; and
an electron-injection layer between the emission layer and the first electrode,
wherein the electron-injection layer comprises a compound $XI_n$,
wherein in $XI_n$ the subscript n is an integer which is in a range of 1 to 3, and
wherein X is a lanthanide element.

10. The display device of claim 9, wherein X is at least one selected from the group consisting of Lu, La, Ce, Pr, Nd, Pm, Sm, Eu, Gd, Tb, Dy, Ho, Er, Tm, and Yb.

11. The display device of claim 9, wherein the electron-injection layer comprises at least one selected from the group consisting of $SmI_2$, $YbI_2$, and $EuI_2$.

12. The display device of claim 9, wherein a thickness of the electron-injection layer is in a range of 1 to 30 Å.

13. The display device of claim 9, wherein the first electrode comprises at least one selected from the group consisting of Ag, Mg, and Yb.

14. The display device of claim 13, wherein the first electrode comprises AgMg, and a content of Ag is greater than that of Mg.

* * * * *